Figure 1:
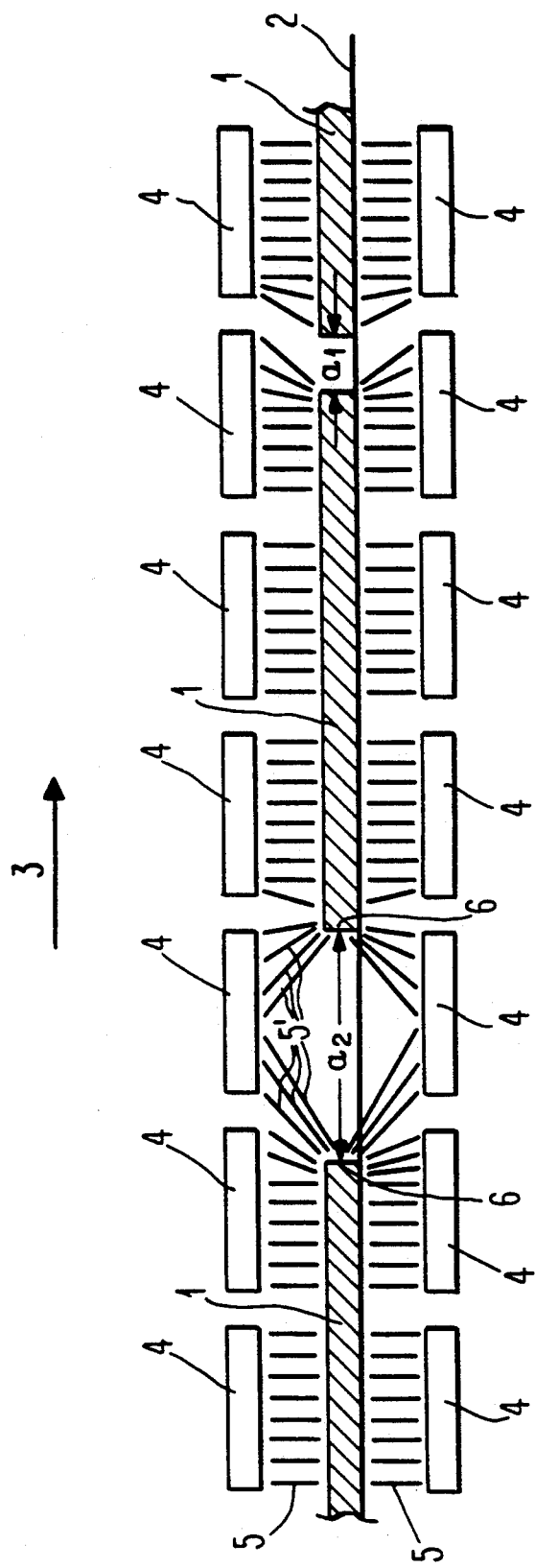

United States Patent
Blasing et al.

[11] Patent Number: 5,292,424
[45] Date of Patent: Mar. 8, 1994

[54] METHOD FOR CONTROLLING THE WORK CYCLE OF ELECTROPLATING PLANTS

[75] Inventors: Horst Blasing, Berlin; Manfred Maurer, Heideck; Rolf Schroder, Burgthann, all of Fed. Rep. of Germany

[73] Assignee: Atotech Deutschland GmbH, Berlin, Fed. Rep. of Germany

[21] Appl. No.: 852,246

[22] PCT Filed: Nov. 30, 1990

[86] PCT No.: PCT/DE90/00943
  § 371 Date: Jun. 18, 1992
  § 102(e) Date: Jun. 18, 1992

[87] PCT Pub. No.: WO91/08327
  PCT Pub. Date: Jun. 13, 1991

[30] Foreign Application Priority Data
  Dec. 1, 1989 [DE] Fed. Rep. of Germany ....... 3939681

[51] Int. Cl.$^5$ .................. C25D 21/12; C25D 19/00
[52] U.S. Cl. ........................... 205/82; 205/96
[58] Field of Search .................... 205/82-84, 205/96, 152; 204/228, DIG. 7, 1.11, 198

[56] References Cited
U.S. PATENT DOCUMENTS

| | | | |
|---|---|---|---|
| 4,240,881 | 12/1980 | Stanya | 204/228 X |
| 4,534,832 | 8/1985 | Doiron, Jr. | 205/96 |
| 5,084,153 | 1/1992 | Mosse et al. | 204/DIG. 7 |

Primary Examiner—Donald R. Valentine
Attorney, Agent, or Firm—Paul & Paul

[57] ABSTRACT

A process and apparatus are disclosed for controlling the flow of operations in electroplating plants with horizontal throughflow in which the parts to be electroplated, in particular plate-shaped parts, pass through the plant in succession and are electroplated by means of currents applied by anodes. In order to prevent undesirable, increased precipitation on the front faces or edges of parts to be electroplated which follow each other at undesirable distances apart, or at least to reduce this precipitation to an acceptable level, the position of the parts which pass through the plant in succession and/or the distances between these parts are detected and the application of the electroplating currents is controlled as a function of these positions and/or distances by switching the anodes on and off, in such a manner that the flux density is approximately the same in all regions of the parts.

10 Claims, 2 Drawing Sheets

METHOD FOR CONTROLLING THE WORK CYCLE OF ELECTROPLATING PLANTS

The invention relates, first, to a method for controlling the work cycle of horizontal, continuously running, electroplating plants, in which the parts to be electroplated, especially plateshaped parts, pass through the plant one after another and are electroplated by means of currents emanating from anodes. In horizontal, continuously operating plants, which are used in particular for the electroplating of printed circuit boards, it is possible for any number of reasons that the individual parts to be electroplated are not conveyed through the plant one immediately after the other, but instead with varying intervals between them. If the interval between the parts is greater than that provided for, the lines of electric force emanating from the anodes which are ordinarily disposed above and below this conveying path become concentrated at the corresponding front edges of the parts which are passing through the plant. This concentration of the lines of force causes a heavier deposition of the metal to be applied by electroplating, in the form of so-called "buds" or in a columnar form. Parts with such buds or columns, for example the above-mentioned printed circuit boards, are at the very least of a much lower quality, if not completely unusable. The removal of such buds or columns from electroplated components is costly and always involves the risk of damaging the plated coating applied to other areas of the part.

In accordance with this the objective of the invention consists of in so improving a method for controlling the work cycle of horizontal, continuously running, electroplating plants that even if the parts to be electroplated follow each other with undesirable intervals between them, undesirable heavier deposits on the affected front faces or edges of the parts are prevented or are at least reduced to a harmless value.

The means by which this objective is achieved are characterized by the fact that the positions of the parts (1) passing through the plant one after another and/or the intervals ($a_1$, $a_2$) between these parts is detected, and that the delivery of the electroplating current is so adjusted by the switching on and off of the anodes (4, 7) adapted to these positions and/or intervals, that the flux density on all regions of the parts (1) is roughly equal. All deviations of the position of the parts to be electroplated from the positions which the parts must have with regard to the arrangement and layout of the electroplating plant can be detected in this way. Based on the above-mentioned deviations, which usually take the form of relatively large, unacceptable intervals between the parts as they follow each other, the anodes of the electroplating plant are switched on and off in such a way that despite the described deviations, the lines of force emanating from the anodes to the parts for electroplating have roughly the same flux density. This prevents a damaging concentration of lines of force and the heavier deposits (buds, etc.) resulting therefrom.

A further objective of the invention is to provide an arrangement which serves to implement the method of the invention.

The arrangement characterized by the fact that provided above and below each anode (4, 7) are sensors, detectors, optical means or like detecting means (11) for checking the plane (2) of conveyance of the parts (1) for the presence (or absence) of parts to be electroplated, and that the means of detection, in a control connection with the current supply to the aforesaid anodes, switch these anodes on and off as required, is provided here for this purpose. Such means of detection are already known. They can be used in the required manner, and especially at the required locations, and further, can be placed at the necessary electrical connection with the electrical means which turns the anodes on and off.

As an alternative to the arrangement described above, an arrangement characterized by the fact that the means of detection (12) is provided at a specified location in the plant, preferably at the location where the parts (1) to be electroplated enter the plant, that this means of detection is in a data connection with a computer, and that the computer converts the results of the detection into the positions of and/or intervals between the parts (1) during their passage through the plant, and that the computer simultaneously controls the switching on and off of the current of the anodes (4, 7) of the plant in accordance with the passage of the parts (1) and the intervals between these parts, can also be implemented as a means of achieving the further objective of the invention. While in the first embodiment the respective regions above and/or below the anodes to be switched on and off are detected, the means described in the second embodiment detects the positions of the components for electroplating relative to each other at a single location in the entire plant, preferably at the location where the components enter the plant. In this arrangement, therefore, the means of detection only needs to be provided once. Since the positions of the parts to be electroplated, relative to each other, especially the intervals between them, no longer changes as they continue to be conveyed through the plant, the positions detected at the location concerned can be fed into a computer and used to calculate the positions of the parts within the plant, and thus their spatial relationship to the anodes, during their passage through the plant. For example, the progress or the "image" of an unacceptably large interval can be tracked through the entire plant and the anodes concerned can be switched off whenever this interval is directly above or below them.

Figure 2:
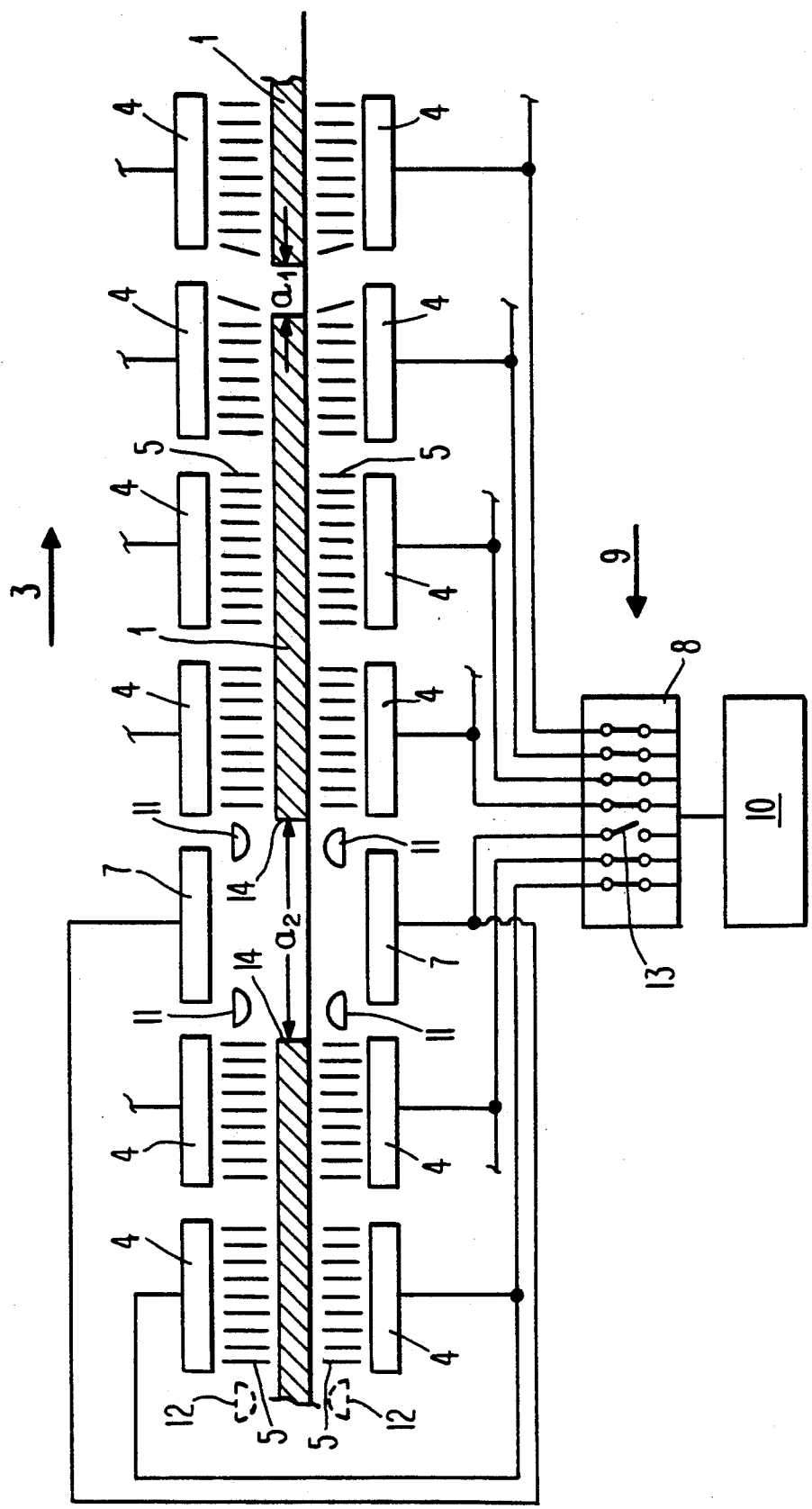

Further advantages and features of the invention can be found in the following description and the accompanying, essentially schematic drawing. The drawing shows:

FIG. 1: a side view in partial cross section of an electroplating plant of prior type as described in the specification;

FIG. 2: a side view in partial cross section of a plant according to the invention.

FIG. 1 is a basic diagram of such a known electroplating plant, seen from the side. The parts 1 to be electroplated, which here are plate-shaped, are made to travel within the plane of transportation in the direction of the arrow 3. The means of transportation and other components of the plant have been omitted from the drawing and the description, since they are not necessary for an explanation of the invention. Anodes 4 are located one behind the other in the direction of transportation 3 with intervals between them, which are not excessively large, above and below the plane of transportation 2. Every two anodes are located one above the other forming a pair in which one anode lies above and the other anode lies below the plane of transport. The parts 1 are so connected with the anodes 4 in a direct-current circuit that lines of force proceeding from the anodes through the electrolytic bath run to the parts 1 and there effect the electroplating. Should it happen that parts 1 passing successively through the plant are not separated by the relatively small interval required $a_1$, but by a comparatively larger interval $a_2$, an undesirable concentration of lines of force 5 occurs at the edges or front faces 6. This is due to the fact that no component 1 attracting or receiving lines of force is present in region $a_2$. Such unacceptably large intervals $a_2$ in comparison to $a_1$ can occur for a variety of reasons. These undesirably large intervals between the individual parts are especially likely to occur in flexible, automatic electroplating plants when the parts to be electroplated are of different sizes, and also with relatively small batches of parts. The heavier deposits described above then form in the regions of the front edges 6.

If the interval between the parts 1 is relatively small, on the order of $a_1$, there is still a certain concentration of the lines of force (see the right-hand portions of FIGS. 1 and 2), but this concentration is so small that it can be ignored.

FIG. 2, in contrast, is a diagram of a plant according to the invention, in which the disadvantages described above of the prior sort are eliminated with regard to both the method and the device. Essentially identical components have been assigned the same numbers as in FIG. 1. Each anode is connected to a controller 8, and the upper and the lower anodes of each pair 4, 7 are always connected in parallel. To simplify the drawing, this is shown in FIG. 2 only with regard to the anode pair 4 on the left and the adjacent anode pair, numbered 7, which will be described in more detail below.

Means of detection, which can operate, for example, optically, inductively or mechanically, are shown schematically and are labeled 11 or 12, depending on the design of the invention.

To simplify the drawing, the means of detection 11 have only been illustrated in the area of anode pair 7. However, in this first exemplary construction of the invention they are correspondingly provided for each additional anode pair 4. They detect the volume between the anodes of a pair and determine whether an interval $a_2$ which is larger that acceptable is present there. If so, the detecting means, in a manner not illustrated more precisely in the drawing, cause the appropriate switch 13 of the controller 8 to open, whereby the anode pair 7 is disconnected from the direct-current source, here a rectifier 10, and thus becomes deenergized. Consequently, no lines of force 5 form between the anodes 7 of this pair, thus eliminating the risk of any undesired deposits on the mutually opposite front edges (here numbered 14), separated by interval $a_2$, of the part 1. Since the parts 1 are being transported in the direction of the arrow 3, the interval $a_2$ will next be located in the region of the following anode pair 4 in the direction of the arrow 3, with the result that this anode pair 4 is then switched off and the previously deenergized anode pair 7 is switched back on, etc. The behavior of the lines of force 5 thus remains constant, as is schematically illustrated in the drawing. In a second exemplary construction of the invention, the aforesaid arrangement of the means of detection can be replaced by the means of detection 12 illustrated in dashed lines at the left of FIG. 2, at the location where the parts 1 enter the plant, where the detecting means detect the intervals between the parts or the positions of the parts and so analyze this data by using a computer, not shown, so that if an unacceptably large interval should occur (see, for example, indicated interval $a_2$) as the parts 1 pass through the anode pairs, the anode pairs concerned are switched off while the parts pass through this interval and are subsequently switched on again. Additional data about the plant, for example the transport speed of the parts 1, can be input into the computer in the same way, as is indicated schematically by the arrow 9. In both of the aforesaid cases the switching on and off of the anodes takes place segmentally, that is, each anode pair represents a segment to be switched on and off as required.

We claim:

1. A method for controlling the work cycle of horizontal, continuously running, electroplating plants, in which parts to be electroplated pass through the plant one after another and are electroplated by means of currents emanating from anodes, characterized by the fact that the positions of the parts (1) passing through the plant one after another and/or the intervals ($a_1$, $a_2$) between these parts is detected, and that the delivery of the electroplating current is so adjusted by the switching on and off of the anodes (4, 7) adapted to these positions and/or intervals, that the flux density on all regions of the parts (1) is roughly equal.

2. A method according to claim 1, characterized by the fact that the anodes (4, 7) are switched on and off segmentally, viewed in the direction of the plant.

3. A method according to claim 1 or 2, characterized by the fact that the transportation speed of the parts is detected.

4. A method according to one of claims 1 to 2, characterized by the fact that provided above and below each anode (4, 7) are detecting means (11) for checking the plane (2) of conveyance of the parts (1) for the presence of parts to be electroplated, and that the means of detection are in a control connection with the current supply to the anodes and switch the anodes, on and off as required.

5. A method according to claim 4, wherein the detecting means comprises sensors, detectors or optical means.

6. A method according to one of claims 1 to 2, characterized by the fact that provided at a specified location in the plant is detection means (12) that is in a data connection with a computer, and that the computer converts the results of the detection into the positions of and/or intervals between the parts (1) during their passage through the plant, and that the computer simultaneously controls the switching on and off of the current to the anodes (4, 7) of the plant in accordance with the passage of the parts (1) and the intervals between the parts.

7. A method according to claim 6, wherein the detection means is provided at a location where the parts to be electroplated enter the plant.

8. A method according to claim 1, characterized by the fact that provided between the direct-current source and each of the anodes (4, 7) is a circuit comprising a controller (8) with a switch (13) for opening and closing each of the circuits, and that the means of detection (11, 12) is connected to the means for activating the switches (13).

9. A method according to claim 1, characterized by the fact that every two anodes (4, 7) are placed one above the other, with one anode above and the other anode below the conveying path (2) for the parts (1), and that the anodes of each pair are connected mutually in parallel to the means for switching them on and off.

10. A method according to claim 1, wherein the parts to be electroplated are plate-shaped parts.

* * * * *